United States Patent [19]

Gault

[11] 4,404,172
[45] Sep. 13, 1983

[54] METHOD AND APPARATUS FOR FORMING AND GROWING A SINGLE CRYSTAL OF A SEMICONDUCTOR COMPOUND

[75] Inventor: William A. Gault, Ewing Township, Mercer County, N.J.

[73] Assignee: Western Electric Company, Inc., New York, N.Y.

[21] Appl. No.: 222,444

[22] Filed: Jan. 5, 1981

[51] Int. Cl.³ .................................................. C30B 21/02
[52] U.S. Cl. ............................. 422/248; 156/DIG. 83; 156/616 R
[58] Field of Search ........ 156/616 R, 616 A, DIG. 83, 156/DIG. 73; 422/248; 219/427; 13/25; 432/158, 249, 253, 262; 164/122.2

[56] References Cited

U.S. PATENT DOCUMENTS

| | | | |
|---|---|---|---|
| 1,279,146 | 9/1918 | Peacock | 219/427 |
| 2,768,277 | 10/1956 | Buck et al. | 219/427 |
| 3,273,969 | 9/1966 | Sirgo | 156/616 R |
| 3,393,054 | 7/1968 | Rupprecht et al. | 156/DIG. 83 |
| 3,514,265 | 5/1970 | Pastore | 23/301 |
| 3,759,310 | 9/1973 | Barrow et al. | 156/616 R |
| 3,857,436 | 12/1974 | Petrov et al. | 156/616 R |
| 3,972,689 | 8/1976 | Knittel | 23/294 R |
| 4,157,373 | 6/1979 | Berkman et al. | 422/246 |
| 4,242,307 | 12/1980 | Fally | 422/248 |

OTHER PUBLICATIONS

Rao, "Preparation of Optical Grade Crystals", Indian J. of Phys., vol. 50, No. 2, Feb. 1976, pp. 378–383.

Primary Examiner—Hiram H. Bernstein
Attorney, Agent, or Firm—Joel F. Spivak

[57] ABSTRACT

An apparatus 10 for growing single crystal semiconductor compounds by the gradient freeze method includes means 40 for reducing radiant heat flow while enhancing axial heat flow in the region of a seed crystal 39 so as to give rise to an inverted solid-liquid interface shape 36 and a desired temperature profile.

7 Claims, 4 Drawing Figures

METHOD AND APPARATUS FOR FORMING AND GROWING A SINGLE CRYSTAL OF A SEMICONDUCTOR COMPOUND

TECHNICAL FIELD

This invention relates to a method and apparatus for growing a single crystal of a semiconductor compound and more particularly, to a method of growing a III-V or II-VI compound employing a seed crystal of the compound with elemental reactants comprising the compound.

BACKGROUND OF THE INVENTION

There have been many attempts made to produce a single crystal semiconductor compound to be used as a substrate for luminescent diodes, transistors, diodes and the like. These compounds are formed by the combination of an element of Group II or III of the Periodic Table and an element of Group VI or Group V, respectively. Since these elements have a vastly different vapor pressure at a given temperature, there is a great deal of difficulty encountered in the formation of a single crystal of the compound, particularly one large enough to be used as a substrate for the commercial, mass manufacture of semiconductor devices. Furthermore, the reproducibility of prior art processes is rather poor.

Various techniques have been employed for growing such crystals including Czochralski growth techniques and Bridgeman-Stockbarger techniques otherwise known as the vertical-gradient freeze method.

U.S. Pat. No. 3,615,203 reveals a method of forming and growing a single crystal of a Group III-V compound. However, a single crystal seed material of the Group III-V compound is not employed and the orientation of the single crystal obtained using this method cannot be predicted. A technique which can form the desired compound from its elements and grow in a single crystal of predictable orientation from a seed material is therefore desired.

Czochralski techniques for growing single crystals of III-V or II-VI compounds have met with limited success due to the decomposition of these compounds and the difference of the vapor pressures of their constituent elements.

In U.S. Pat. No. 4,083,748 I have described a method and apparatus for simultaneously synthesizing the desired semiconductor compound and growing a single crystal of the semiconductor compound comprising a Group II-VI or Group III-V compound. The method disclosed therein comprises placing a single crystal seed of the semiconductor compound adjacent a first reactant comprising a Group II or Group III element. A protective blanket, resulting from a second reactant of a Group VI or Group V element, respectively, is formed over the seed within the temperature zone to protect the seed from dissolution from the first reactant. Reactants are combined to form a melt at a first temperature within the temperature zone and to synthesize and then grow a single crystal from the melt on the seed at a second temperature within the temperature zone. By this method one can synthesize and grow single crystals of predictable orientation. However, limited results indicated incomplete synthesis resulting in waste of starting materials and in the case of gallium phosphide, for example, incorporation of metallic gallium interspersed in the grown crystal.

I have now altered the technique taught in my previous patent by changes in the apparatus and in the thermal profile used in order to obtain single crystals of III-V and II-VI compounds having relatively low dislocation densities and in many instances large areas essentially free of dislocations. Also, this new technique, which is used for growing single crystals and not synthesis of the compound, has shown the capability of being more reproducible than prior art techniques and at least after the first 3 hours, can go unattended to completion.

SUMMARY OF THE INVENTION

Semiconductor compounds are grown by a seeded vertical-gradient freeze technique. In accordance with this technique, there is provided a crucible having a seed well at the bottom thereof, an inclined conical neck portion extending from the seed well and a main cylindrical portion extending from the top of the neck region. A support member supports the crucible along the conical neck portion. The support member is provided with means, in the form of at least one axially concentric vertical slot extending from the top thereof to a depth substantially adjacent the bottom of the seed well, for reducing radial heat flow while enhancing vertical or axially heat flow in the region of the seed well and the neck region of the growth crucible.

By employing an apparatus having the support pedestal, as indicated above, and a desired heater configuration, there may be provided the desired non-linear vertical temperature profile for crystal growth wherein the steepest temperature gradient of the profile is in the region of the seed well, a less steep temperature gradient exists in the transition area (the inclined conical neck portion) and still a less steep gradient exists in the main cylindrical portion of the growing crystal. By maintaining this type of thermal profile, while slowly reducing the absolute temperatures of the crucible, an improved crystal growth can be maintained.

DETAILED DESCRIPTION

The present invention will be described mainly in terms of growing GaP. However, it will be understood that such description is merely exemplary and that the inventive concept described is equally applicable to the growth of other III-V compounds or of the growth of II-VI compounds. It may also be noted that the apparatus of the present invention is similar to the apparatus previously described in U.S. Pat. No. 4,083,748 but includes several improvements over that apparatus.

Figure 1:
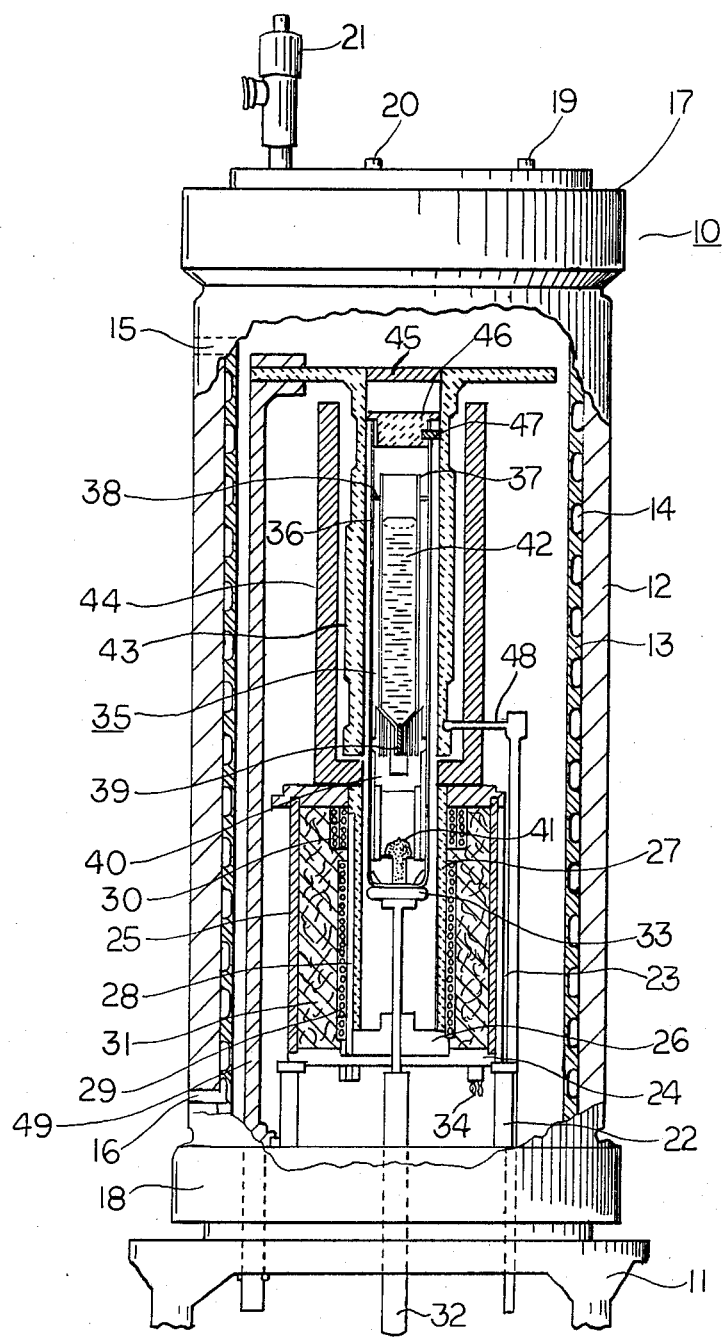
FIG. 1 is a partially isometric cross-sectional view of an apparatus for growing a single crystal semiconductor compound according to the invention.

Referring now to FIG. 1, there is shown an apparatus useful for practicing the subject invention. The apparatus comprises a suitable high temperature autoclave 10 set on a stand 11 which is provided with necessary feedthroughs for elements contained in the autoclave 10. Typically, the autoclave 10 comprises a high strength, steel shell 12 with a stainless steel liner 13. The stainless steel liner 13 is formed so as to provide a water cooling channel 14 with water inlet and outlet ports 15 and 16, respectively. The ports 15 and 16 extend through the steel shell 12 and communicate with the channel 14. The channel 14 extends circumferentially around the liner 13 spirally downward from the inlet port 15 to the outlet port 16. The autoclave 10 is provided with top and bottom caps 17 and 18, respectively. Top cap 17 is cooled by internal water channels (not shown) provided therein which are fed through inlet and outlet ports 19 and 20, respectively. A pressure-vacuum valve 21 is also provided through the top cap so as to communicate with the inside of the autoclave 10. A plurality of adjustable upright support rods 22 are provided at the bottom of the autoclave 10. The support rods 22 support a first heater for heating the more volatile group V or group VI element. This heater 23 comprises a base 24 and a cylindrical housing 25 resting on the base 24. Centered within the housing 25 and resting on the base 24 is a ceramic insulator 26 having a central hole therethrough. A cylindrical graphite heating core 27 is supported on the insulator 26. The heating core 27 is provided with a thermocouple well 28 in the form of a groove extending axially along the length of the core 27. Heating elements 29 and 30 are wrapped around the graphite heating core 27. Different temperatures can be provided for different zones adjacent the heater 23 by means of the separate heating elements 29 and 30 of this heater 23. Insulation 31 such as a Fiberfrax ® insulation made by Carborundum Company is provided between the resistance heating elements 29 and the housing 25. A pressure sealed rotatable and axially movable rod 32 having a graphite pedestal 33 on the top thereof extends from the bottom of the autoclave 10 through pressure and vacuum type bushings (not shown) into the internal portion of the autoclave and through the hole provided in insulator 26 of the lower heater 23. A hole in the base plate 24 is provided for the electrical wires 34 of the resistance heating elements in order to supply electric power thereto.

Resting on the pedestal 33 is a container 35. The container 35 can best be seen with reference to FIG. 2. The container 35 comprises a material which is inert to the reactants, e.g., gallium and phosphorus, zinc and sulfur, indium and phosphorus, etc., and the resultant compounds, e.g., GaP, ZnS, InP, etc., respectively, at the temperatures and pressures destined to be employed for the synthesis and single crystal growth of the Group II-VI or III-V compound. A preferred material for the container 35 is pyrolytic boron nitride or quartz. The container 35 comprises an outer chamber 36 and a crystal growth crucible 37 supported in the upper portion of the outer chamber 36, both chambers 36 and 37, preferably being comprised of pyrolytic boron nitride. Growth crucible 37 is supported near the top portion thereof by support disc 38. Growth crucible 37 which is also preferably made of pyrolytic boron nitride houses polycrystalline semiconductor starting material 42. It consists of a main cylindrical portion, an inclined conical neck or transition region and an elongated seed well 39 at the bottom thereof. The growth crucible 37 is supported within the container 35 by a specially designed inert spacer support member 40 typically comprising alumina or BN and having chanels 55 which allows the vapors of a second material 41, i.e., a Group VI or Group V element, to communicate with the polycrystalline semiconductor compound 42 contained in the growth crucible 37 and to provide a vapor blanket over the melt of the semiconductor compound 42 to control stoichiometry of the growing crystal.

Referring again to FIG. 1, the container 35 is surrounded by a heater 43 of special design, preferably graphite. The heater 43 is in turn surrounded by a radiation shield 44 which extends along the length of the heater 43 and below the heater 43. A second radiation shield 45 is provided over the reaction vessel 35. The reaction vessel 35 is capped at the top thereof by means of a BN cap 46 which is provided with retaining pins 47. A plurality of thermocouples are provided to monitor the temperature of the heater 43. One such thermocouple 48 is shown to extend into the heater 43 in the region adjacent the top of the seed well 39. The output of the thermocouple supplies an input signal to a temperature controller (not shown) to control the operating temperature. An electrical bus bar 49 which provides one of the electrical connections for the heater 43, is shown to extend adjacent the liner 13 and through the bottom of the apparatus 10 where an electrical connection is provided. A second bus bar (not shown) must also be provided to complete the necessary electrical circuit for activating the heater 43.

Figure 2:
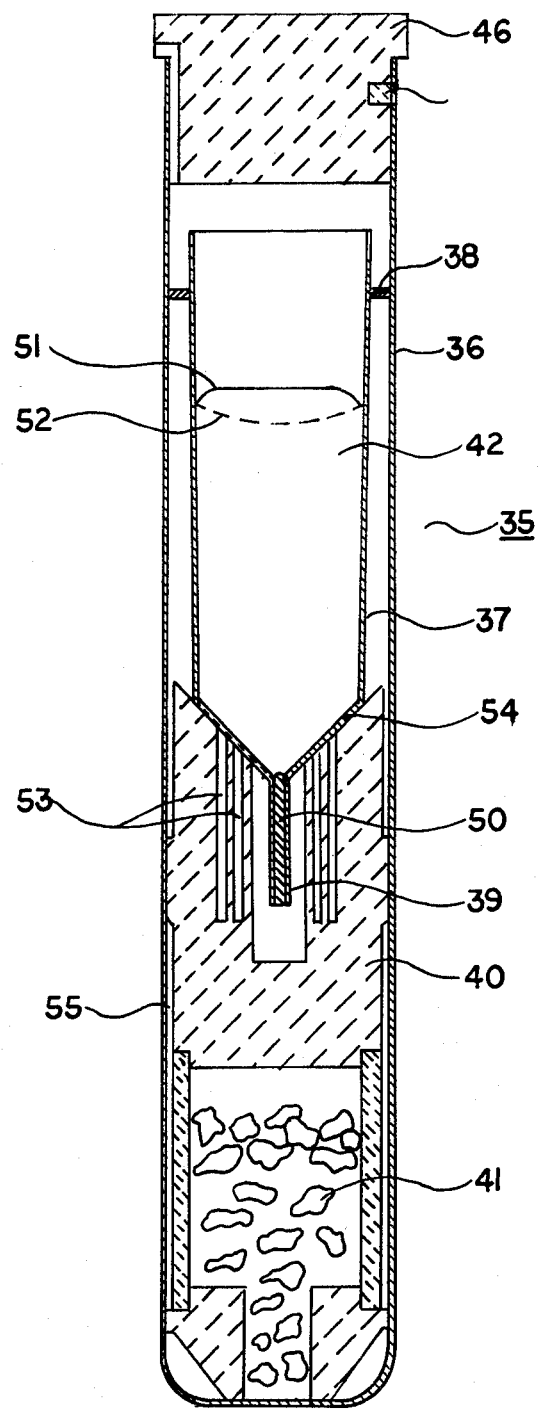
FIG. 2 is a cross-sectional elevational view of the container portion of the apparatus of FIG. 1.

Referring to FIG. 2, a clearer depiction of the inert spacer support member 40 can be seen. The support member 40, as shown, is provided with a plurality of axially extending spaced channels which extend axially and circumferentially around the element 40 from its conical top portion 54, upon which rests the conical portion of the growth crucible 37, downwardly to a depth adjacent to below the bottom of the seed well 39 which rests within a central cavity of the support member 40. This configuration of the support member 40 causes a reduction in radiant heat flow and enhancement of the vertical or axial heat flow in the seed well 39 and transition regions of the growth crucible 37. The solid-liquid interface shape 51 thus formed by the molten material 42 at the solid-liquid interface of the molten compound and the growing single crystal is shown to be inverted as compared to the normal or interface shape 52 obtained in the absence of the channels 53, shown as a dotted line in FIG. 2. This inversion of interface shape is due to the temperature gradient and the heat flow produced due to the channels 53 in the element 40. It has been observed that improved, low dislocation density, large crystals of the semiconductor compounds can be grown when employing such a configuration. In fact, in the growth of GaP, if the axial heat flow is not sufficient enough to obtain the desired liquid-solid interface shape, polycrystalline growth is often observed.

Also, of extreme importance in obtaining the desired high quality crystals which is related to and achievable because of the heat flow attained is the steep temperature gradient in the region of the seed well with a lowering of the temperature gradient in the transition zone and a further lowering of the gradient in the main or growth portion of the vessel 37. Typically, preferred gradients for each of these regions are 100°–130° C./in., 80°–100° C./in. and 15°–20° C./in., respectively. Generally, useful gradients for the respective regions are 60°–130° C./in., 15°–110° C./in. and 15°–35° C./in. with the gradient in the seed well region always being greater than the gradient in the neck or transition region.

Figure 3:
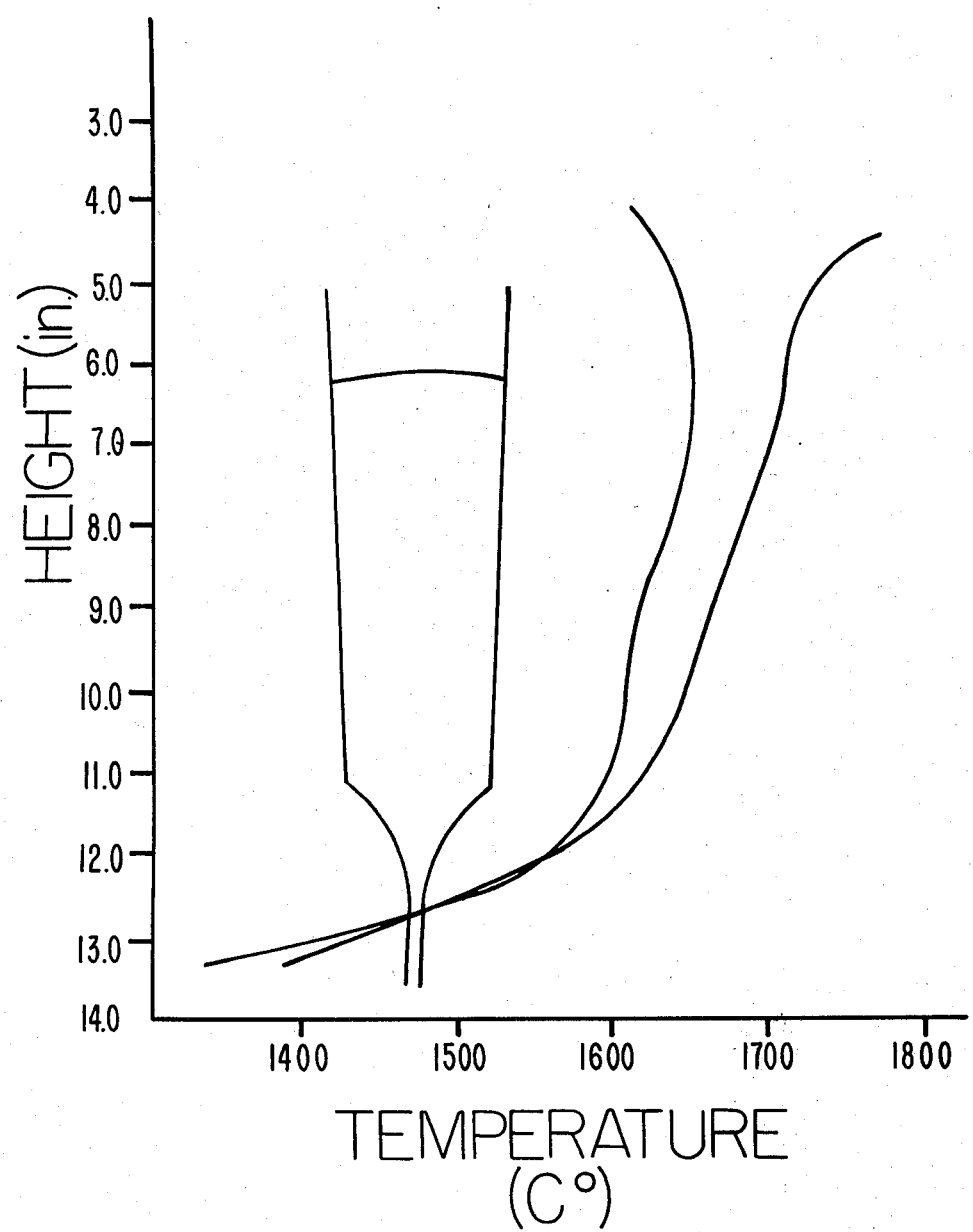
FIG. 3 is a graph indicating a typical thermal profile employed in the novel method of the invention.

FIG. 3 indicates typical temperature profiles along the length of the growth crucible 37 for the growth of gallium phosphide. It should be noted that the ordinate height in FIG. 3 need not be absolute but relative to the total height of the vessel. It can be seen that the highest rate of change of temperature (°C./in.) occurs in the region of the seed well and diminishes as one goes up the length of the growth crucible 37.

Figure 4:
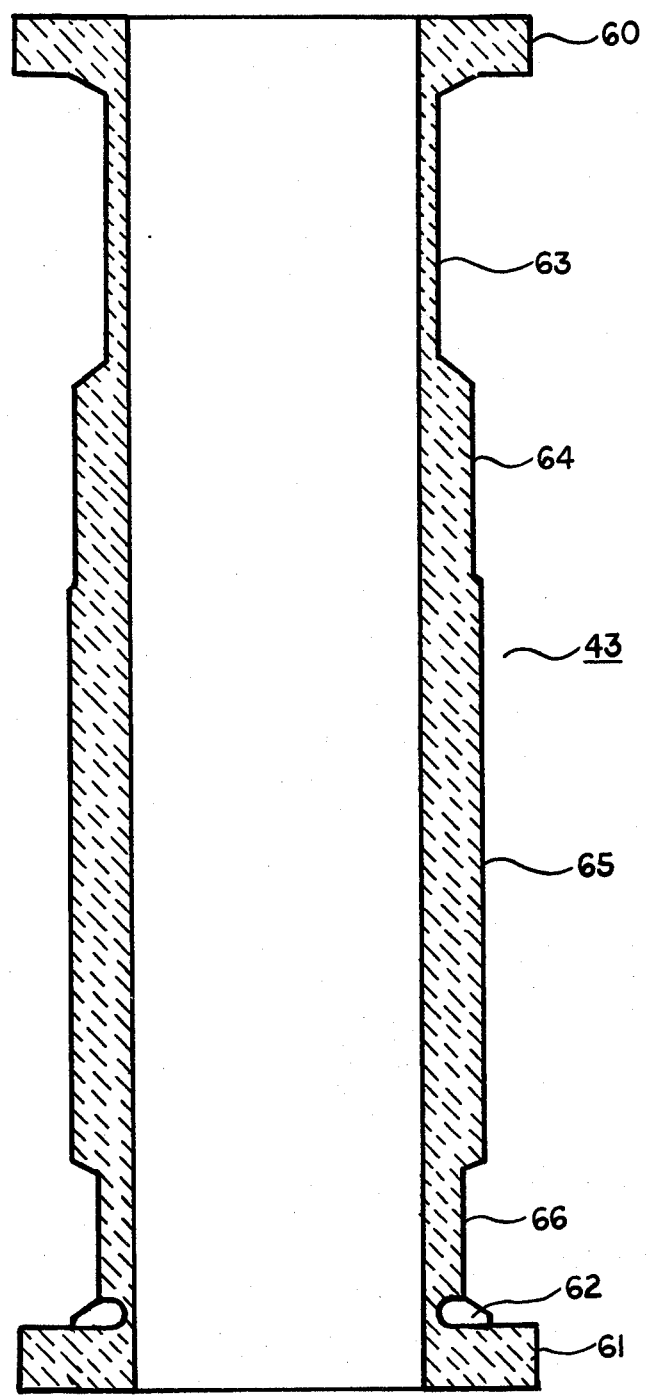
FIG. 4 is a cross-sectional elevational view of a novel heater employed in the novel apparatus.

FIG. 4 which shows a blow-up of the graphite heater 43 indicates a cylindrical heater having different thicknesses along its length. For example, regions 63, 64, 65 and 66 of the heater each have different cross-sectional thicknesses. The ends of the heater 43 are provided with flange means for making electrical contact thereto. Additionally, the heater 43 is typically of a "picket fence" configuration, e.g., a graphite cylinder having slots cut longitudinally therein, where each second slot terminates at the bottom portion of the cylinder. By providing a heater of this configuration and having different thicknesses along its length, one can obtain a predetermined and variable heat flow from different portions of the heating element 43. This in turn provides greater control in obtaining the desired temperature gradients in the growth crucible. It should be noted that the heater 43 preferably extends essentially from adjacent the bottom of the seed well 39 to and beyond the top of the container 35.

The single crystal seed material placed in the seed well is cut along a desired crystal axis and is preferentially rounded and snug fit into the seed well. This snug fit and shape has unexpectedly enhanced the quality of grown crystals.

It should be noted that while the preferred embodiment has a seed well, as shown, which is elongated and rests within a hole provided therefor in support 40, the lower portion of the growth crucible can be an extension of the conical neck region so as to terminate at a point and the region near the bottom would then be considered the seed well for the purpose of this invention.

Furthermore, while the slots 53, as shown for the growth of GaP, are preferred to be empty except for ambient gases, it is also contemplated herein to fill the slots with various materials which can alter the amount of axial and/or radial heat flow from the growth crucible. For example, one may employ a metal, e.g., gallium or a composite, e.g., a metal quartz laminate or a refractory, e.g., graphite, in one or more of the slots to change the thermal characteristics in order to obtain the desired axial heat flow.

In operation, the group V or VI element, e.g., phosphorus, is placed in the bottom of the chamber 35, a desired seed crystal is snugly fit within the seed well 39 and the remainder of the growth crucible is filled with an appropriate quantity of polycrystalline material of the desired semiconductor compound. The container is then positioned within the apparatus 10 which is then first evacuated and subsequently pressurized to a desired pressure, generally in excess of one atmosphere with an inert gas, e.g., argon or nitrogen. The heaters are then turned on and allowed to reach a steady state at the desired indicated temperatures and the chamber is preferably rotated by means of the shaft and pedestal 32 and 33. It may be noted that the temperatures indicated by the thermocouple placed at the heater are generally greater than the actual temperatures within the growth crucible. However, the indicated temperatures still accurately show the temperature gradients and are a measure of the actual temperature in the growth crucible.

At the steady-state temperature of the volatile material 41, that material forms a vapor which then covers the GaP melt. After the steady-state temperature is reached, the temperature of the upper heater 43 is raised slightly in order to melt back a portion of the seed crystal so as to provide a clean surface for the initial growth. At this time the growth crucible is automatically controlled to provide a temperature soak period followed by slow cooling at a predetermined cooling rate so as to initiate growth at the seed crystal and promote continued growth of single crystal material. When growth is complete power may be turned off.

It will be understood by those skilled in the art that the particular temperatures, pressures, cooling rates, etc. employed will depend upon the particular semiconductor compound being grown. These parameters can easily be ascertained based upon the disclosure contained herein.

EXAMPLES

By way of example, the parameters employed for growing single crystal GaP in a nine inch crucible having about a 1½ inch seed well and a one inch conical transition region are as follows:

(a) <111> oriented rounded single crystal seed is snugly fit into the seed well and the growth crucible is then loaded with 1,010 g of polycrystalline GaP. Red phosphorus (μ100 g) is placed at the bottom of the outer chamber. The container is placed into the apparatus and the apparatus is sealed.

The apparatus is then evacuated to 76 microns and thence backfilled and pressurized to 810 psi (abs) with argon. The phosphorus (lower) heater and GaP (upper) heaters are turned on so as to reach indicated steady state temperatures of 590° C. and 1525° C., respectively. After soaking at these temperatures for about ½ hour, the indicated temperature of the GaP heater is raised to 1530° C. for one hour and then to 1535° C. for about an additional hour in order to melt back a small portion of the seed crystal. Care must be taken not to melt the entire seed crystal. At this time, cooling of the GaP heater is initiated at the following rates and for the following time intervals:

(a) 15°/hr. for 11 hours; then
(b) 8°/hr. for 12 hours; then
(c) 6°/hr. for 30 hours; and finally
(d) 100°/hr. for 5 hours.

Thereafter all power is turned off. The growth process is done, including soaking while slowly rotating the growth crucible. By using the novel apparatus, a steep temperature gradient exists in the seed well of about 170° C./in. at the bottom of the seed well, declining to an average of about 110° C./in. in the transition region and an average of about 30° C./in. in the main portion of the growth crucible.

What is claimed is:

1. An apparatus for growing a single crystal of a Group II-VI or III-V semiconductor compound by the gradient zone freeze method including:
   (a) an autoclave having contained therein:
      (i) a chamber provided with heating means for containing and volatilizing the volatile component of the compound to be grown:
      (ii) a growth crucible communicating with the chamber so that an atmosphere of said volatile component is provided in the growth crucible during crystal growth and having a lower seed well region for containing a seed crystal and a transition region and main growth region extending therefrom for containing charge material of the compound; and
(iii) support means for supporting said crucible, said support means having a configuration so as to cause reduction of radial heat flow and an enhancement of axial heat flow at least around the seed well and transition regions of said crucible during crystal growth.

2. The apparatus recited in claim 1 wherein said seed well is a narrow elongated member extending from the bottom of a conical transition region.

3. The apparatus recited in claim 1 wherein said support means comprises at least one vertical slot extending parallel to the axis of the growth crucible.

4. The apparatus recited in claim 6 wherein said support means is comprised of graphite or boron nitride.

5. An apparatus for growing a single crystal of a Group II-VI or III-V semiconductor compound by the gradient zone freeze method including:
(a) an autoclave having contained therein:
(i) a chamber provided with heating means for containing and volatilizing the volatile component of the compound to be grown:
(ii) a growth crucible communicating with the chamber so that an atmosphere of said volatile component is provided in the growth crucible during crystal growth and having a lower seed well region for containing a seed crystal, a transition region extending from the seed well, and a main growth region extending from the top of the transition region; and
(iii) means associated with the growth crucible for causing an inversion or flattening of the normally occurring meniscus at the liquid-solid interface at least during the initial period of crystal growth.

6. An apparatus for growing a single crystal of a semiconductor compound by the gradient zone freeze method including:
(a) a growth crucible having a lower seed well region for containing a seed crystal and a transition region and main growth region extending therefrom for containing charge material of the compound; and
(b) support means for supporting said crucible, said support means having a configuration so as to cause reduction of radial heat flow and an enhancement of axial heat flow at least around the seed well and transition regions of said crucible during crystal growth, and wherein said seed well is a narrow elongated member positioned in a hole provided therefor in said support means and wherein said support means includes a plurality of vertical slots extending parallel to the axis of the growth crucible, said vertical slots extending from the top surface of said support means to a depth substantially adjacent to the bottom of said seed well.

7. An apparatus for growing a single crystal of a semiconductor compound by the gradient zone freeze method including:
(a) a growth crucible having a lower seed well region for containing a seed crystal, a transition region extending from the seed well, and a main growth region extending from the top of the transition region; and
(b) means associated with the growth crucible for causing an inversion or flattening of the normally occurring meniscus at the liquid-solid interface at least during the initial period of crystal growth comprising a support member which supports said crucible at said transition region and which is provided with a plurality of concentric axially extending slots extending downwardly from its supporting surface.

* * * * *